United States Patent [19]
Raffel et al.

[11] Patent Number: 4,585,490
[45] Date of Patent: Apr. 29, 1986

[54] METHOD OF MAKING A CONDUCTIVE PATH IN MULTI-LAYER METAL STRUCTURES BY LOW POWER LASER BEAM

[75] Inventors: Jack I. Raffel; John A. Yasaitis, both of Lexington; Glenn H. Chapman, Bedford; Mark L. Naiman, Lincoln, all of Mass.

[73] Assignee: Massachusetts Institute of Technology, Cambridge, Mass.

[21] Appl. No.: 657,128

[22] Filed: Oct. 3, 1984

Related U.S. Application Data

[62] Division of Ser. No. 328,356, Dec. 7, 1981, abandoned.
[51] Int. Cl.$^4$ .................... H01L 21/265; B23K 27/00
[52] U.S. Cl. ...................................... 148/1.5; 29/574; 29/576 B; 29/578; 148/187; 357/91
[58] Field of Search ............... 148/1.5, 187; 29/576 B, 29/574, 578; 357/91

[56] References Cited

U.S. PATENT DOCUMENTS

| | | | |
|---|---|---|---|
| 3,771,026 | 11/1973 | Asai et al. | 148/1.5 |
| 4,023,005 | 5/1977 | Bolin | 219/121 LM |
| 4,151,545 | 4/1979 | Schnepf et al. | 357/57 |
| 4,168,444 | 9/1979 | van Santen | 357/59 |
| 4,177,474 | 12/1979 | Ovshinsky | 357/2 |
| 4,190,855 | 2/1980 | Inoue | 357/80 |
| 4,270,137 | 5/1981 | Coe | 357/59 |
| 4,270,960 | 6/1981 | Bollen et al. | 148/175 |
| 4,272,775 | 6/1981 | Compton et al. | 357/29 |
| 4,275,410 | 6/1981 | Grinberg et al. | 357/68 |
| 4,289,834 | 9/1981 | Alcorn et al. | 357/68 |
| 4,335,362 | 6/1982 | Salathe' et al. | 357/67 |
| 4,372,989 | 2/1983 | Menzel | 427/53.1 |
| 4,387,503 | 6/1983 | Aswell et al. | 29/576 B |
| 4,398,343 | 8/1983 | Yamazaki | 148/1.5 |
| 4,413,272 | 11/1983 | Mochizuki et al. | 357/65 |
| 4,437,109 | 3/1984 | Anthony et al. | 357/68 |
| 4,438,450 | 3/1984 | Sheng et al. | 357/68 |
| 4,446,613 | 5/1984 | Beinglass et al. | 29/571 |
| 4,456,490 | 6/1984 | Dutta et al. | 148/1.5 |
| 4,462,150 | 7/1984 | Nishimura et al. | 29/576 B |
| 4,467,312 | 8/1984 | Komatsu | 148/1.5 |

FOREIGN PATENT DOCUMENTS

| | | |
|---|---|---|
| 1010156 | 5/1977 | Canada . |
| 135865 | 5/1977 | Japan . |
| 53-26689 | 3/1978 | Japan . |
| 085122 | 2/1979 | Japan . |

OTHER PUBLICATIONS

Aggarwal, B. K., IBM-TDB, 21 (1979) 3271.
Drowley et al. in Laser-Solid Interactions ... Materials Ed (J. Narayan et al.), North-Holland, N.Y. 1982, p. 529.
O. Minato, et al., "A High-Speed Hi-CMOSII 4K Static RAM", pp. 449-453, IEEE Journal of Solid-State Circuits, v. SC-16, No. 5, Oct. 1981.
J. M. Harris et al., "Solid-Phase Crystallization of Si Films in Contact with Al Layers", pp. 2897-2904, Journal of Applied Physics, V. 48, No. 7, Jul., 1977.
M. Hongo, et al., "THD2 Connecting Conductors on Semiconductor Devices by Lasers" Hitachi, Ltd. 4/15/82.
J. I. Raffel et al., "Laser Programmed Vias for Restructurable VLSI*", pp. 132-135, Int'l Electron Devices Meeting, 12/1980.
J. G. Posa, "Redundancy-What to do When the Bits go Out", 7/28/81, pp. 117-120, Electronics.
G. H. Chapman et al., "A Laser Linking Process for Restructurable VLSI*", MIT, CLEO '82, 4/14–16/82, Phoenix, Ariz.
J. F. Smith et al., "Laser Induced Personalization & Alterations of LSI & VLSI Circuits", IBM Corporation.
E. E. Conrad, "Aluminum-Copper-Silicon Semiconductor Metallurgy", IBM Technical Disclosure Bulletin, vol. 13 (1971), p. 3661.
J. Leff, "Aluminum-Silicon Conductor Formation", IBM Technical Disclosure Bulletin, vol. 12 (1970), p. 1996.

Primary Examiner—Upendra Roy
Attorney, Agent, or Firm—Kenway & Jenney

[57] ABSTRACT

An integrated circuit device including a link point for electrically connecting a plurality of metal layers, comprising a first metal layer, a link insulating layer, a second metal layer and diffusion barrier layers between the link insulator layer and each of the first metal layer and the second metal layer. The metal layers are connected by exposing the link point to a low-power laser for a relatively long pulse width.

3 Claims, 8 Drawing Figures

METHOD OF MAKING A CONDUCTIVE PATH IN MULTI-LAYER METAL STRUCTURES BY LOW POWER LASER BEAM

BACKGROUND OF THE INVENTION

The Government has rights in this invention pursuant to Contract No. F19628-80-C-0002 awarded by the Department of the Air Force.

this is a division of application Ser. No. 328,356 filed Dec. 7, 1981 abandoned.

This invention relates to novel interconnect wiring arrangements on a silicon wafer and to methods for producing the same. More particularly, the present invention relates to methods for interconnecting a plurality of metal layers on a silicon wafer after transistors and wiring have been patterned and fabricated.

Prior to the present invention, metal layers each positioned on a different vertical height, separated by an insulating layer and positioned on a silicon wafer had been connected by means of relatively high power lasers such as dye lasers utilizing one or more pulses, each a few nanoseconds wide. The laser power is sufficiently high as to effect opening of the top metal layer, usually aluminum, removal of the intermediate silicon-containing layer by microexplosions and migration of metal into the opening through the insulating layer thickness to effect electrical contact between the metal layers. Typically, the laser power utilized is several kilowatts and the width of each pulse is between about 2 and 6 nanoseconds. The major problem with this prior technique for forming interconnections is that the high-powered laser causes microexplosions which, in turn, cause splatter of metal to occur. This results in poor control in forming electrically conductive paths in the desired pattern. In addition, this technique is generally unsuitable for cutting established conductive paths because of this metal splattering which many times creates new undesirable conductive paths.

It would be highly desirable to provide a means for interconnecting different metal layers positioned on a silicon wafer in a manner which provides relatively uniform conduction paths without the formation of new undesirable conductive paths. In addition, it would be desirable to provide such means which also is useful for cutting established conductive paths without creating new undesirable conductive paths.

SUMMARY OF THE INVENTION

The present invention provides an integrated circuit device which includes a plurality of metal layers with a link insulator layer interposed between the metal layers. The composition of the link insulator is capable of alloying with the metal in the metal layers to form a conductive path between the metal layers. A link point comprising the two metal layers and the link insulator layer can be set apart from a first main conductive path formed of the first metal and a second main conductive path formed of the second metal so that the metal layers in the link point can be interconnected or one or more of the metal layers in the link point can be electrically disconnected from the main conductive paths. Alternatively, the metal layers of the link point can each comprise the first main conductive path of the second main conductive. Interconnection of the metal layers in the link point is achieved by exposing the link point to a low power laser having a pulse in the order of about 1 millisecond. When utilizing these laser conditions, low resistivity connections can be achieved without damage to the base oxide, thereby avoiding exposure to the substrate.

DESCRIPTION OF SPECIFIC EMBODIMENTS

Figure 1:
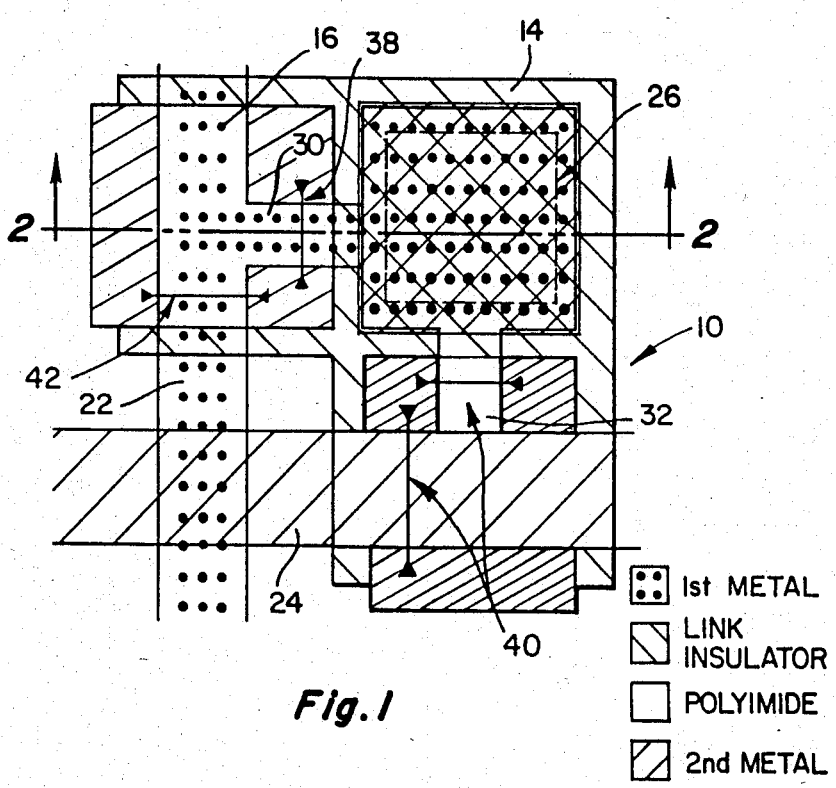
FIG. 1 is a top view of a section of an integrated circuit device of this invention with the link point set apart from the main conductive paths.
Figure 2:
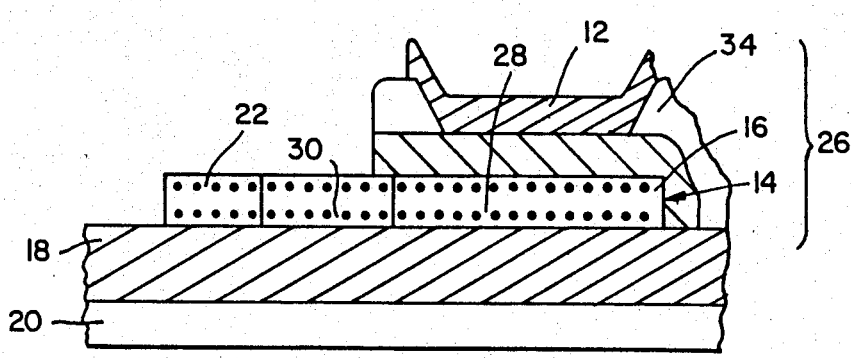
FIG. 2 is a cross-sectional view of FIG. 1 taken along line 2—2.
Figure 3:
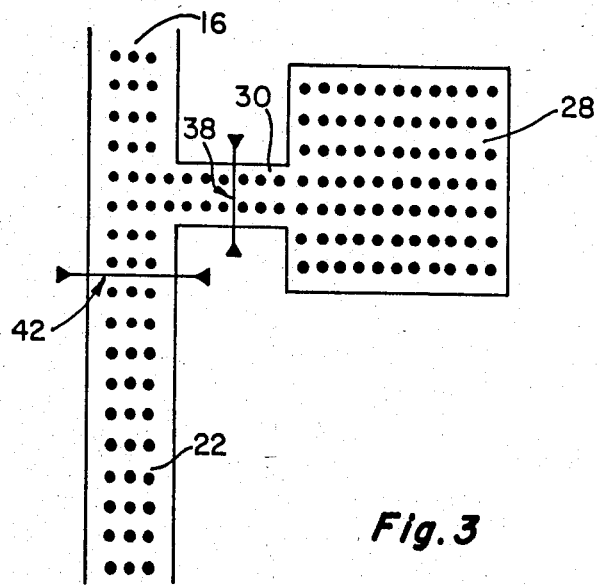
FIG. 3 is a top view of the first metal layer of the device of FIG. 1.
Figure 4:
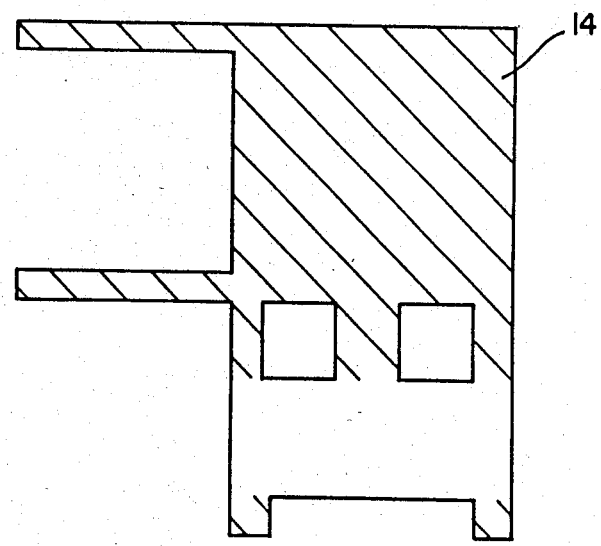
FIG. 4 is a top view of the link insulator of the device of FIG. 1.
Figure 5:
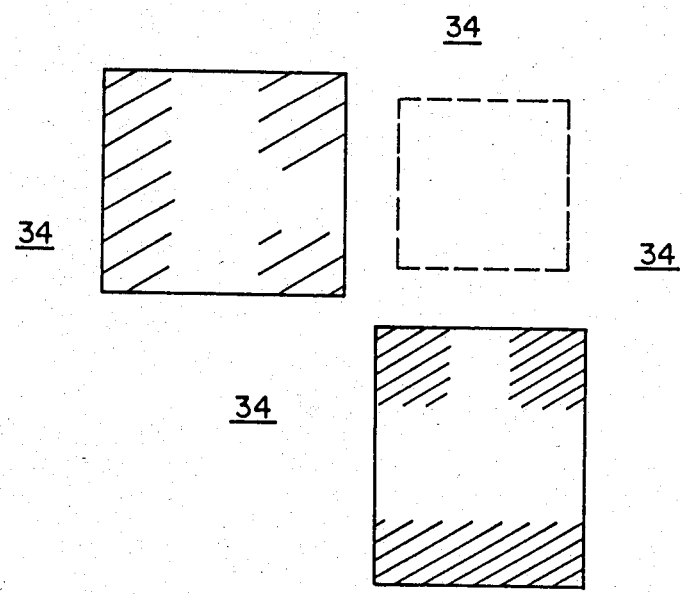
FIG. 5 is a top view of the surface of the device of FIG. 1 lacking polyimide.
Figure 6:
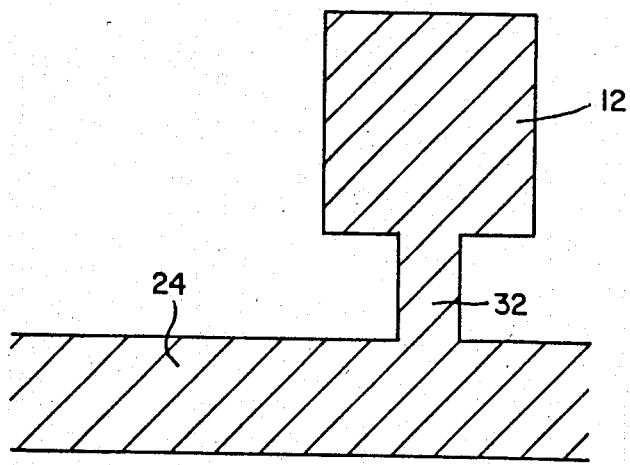
FIG. 6 is a top view of the second metal layer of the device of FIG. 1.

Referring to FIGS. 1 through 6, the integrated circuit device 10 of this invention comprises a first metal layer 12, a link insulator layer 14 and a second metal layer 16 which is supported on a base oxide 18 and a substrate 20. The first metal layer 12 is configured so that it includes a first main conductive path 22. The second metal layer 16 includes a second main conductive path 24. The first main conductive path 22 and the second main conductive path 24 provide means for electrically connecting the integrated circuit device of this invention to other electrical components into which the device is incorporated by any conventional means. A link point 26 is comprised of a sandwich of the first metal 12, the link insulator 14 and the second metal 16. The link point 26 is set apart from the first main conductive path 24 so that electrical connection between the first metal layer 12 and the second metal layer 16 can be effective without interrupting the main conductive paths 22 and 24. In addition, the first metal section 28 which forms part of the link point 26 is electrically connected to the first main conductive path 22 by means of bridge 30 formed of the first metal. Similarly, the second metal 16 which forms a part of the link point 26 is electrically connected to the second main conductive path 24 by means of bridge 32 formed of the second metal. The polyimide layer 34 can be formed on all sections of the integrated circuit device with the exception of the link point so that, at the link point, the second metal 16 directly contacts the link insulator material 14.

The first metal layer 12 and the second metal layer 16 can be formed of any electrically conducting metal or alloy capable of interacting with the link insulator layer to form an electrically conductive path including aluminum. Al-Si-Cu alloys or the like metals capable of forming silicides or the like may be formed from insulating materials capable of being doped by mixing or alloying with the first metal 12 and the second metal 16 to form an electrically conductive path through the thickness of the link insulator layer 14. Suitable link insulator layers include amorphous germanium, amorphous silicon, undoped polysilicon, polycrystalline germanium or the like. A barrier layer is interposed between the link insulator layer 14 and each of the metal layers 12 and 16 in order to prevent diffusion of metal into the link insulator. Suitable diffusion barriers include silicon dioxide, silicon nitride, refractory nitrides such as tungsten nitride, titanium nitride or the like. Typical thicknesses for the diffusion barrier layer is between $0.1\mu$ and $1\mu$ which permits formation of the electrical path between the first and second metals and provides the diffusion barrier. It is preferred that the first and second metals comprise aluminum or its alloys and that the link insulator material comprise amorphous silicon. The electrically conductive path through the link insulator layer 14 is formed by means of a low-power laser opening in the $0.2\mu$ to $1\mu$ range, such as an argon laser or the like, laser operating at a power between about 1 and about 3 watts, preferably between about 1 and about 1.5 watts for a light beam about 3 microns in diameter. For light beams having a smaller diameter, lower power lasers can be utilized to obtain equivalent power densities. The link point is exposed to the laser for a period of time of between about 0.01 and about 10 milliseconds, preferably about 0.1 and about 1 milliseconds. In forming the link point, the exposed second metal surface 16 of the link point 26 is exposed to the laser to form a hole through the link insulator layer 14 while permitting alloying along the exposed surface of the hole, thereby connecting the first and second metals. In order to achieve this desired electrical path, without disturbing the base oxide 18, the thickness of the link insulator material should be between about $0.2\mu$ and about $2\mu$, preferably between about $0.5\mu$ and $1\mu$ while the first and second metal layers should have a thickness of between and $0.3\mu$ and about $2\mu$, preferably between about $0.5\mu$ and about $1\mu$. The base oxide typically comprises silicon dioxide, and can have a thickness between about $0.4\mu$ and about $2\mu$. The substrate can comprise crystalline silicon, GaAs, or silicon on insulator. Electrical connection to the link point 26 from the main conductive paths 22 and 24 through bridges 30 and/or 32 can be cut by exposing the bridges 30 or 32 to a laser under the same condition set forth above for forming the link point. The bridges 30 and/or 32 can be cut by the laser at cut points 36 and 38. In addition, the main conductive paths 22 and 24 can be cut with a laser under these same conditions at cut points 40 and 42 when desired. Only one metal layer 12 or 16 is positioned at cut points 36, 38, 40 and 42. If more than one metal layer were present at the cut points 36, 38, 40 and 42, the undesirable possibility of electrically connecting the metal layers would be present.

Figure 7:
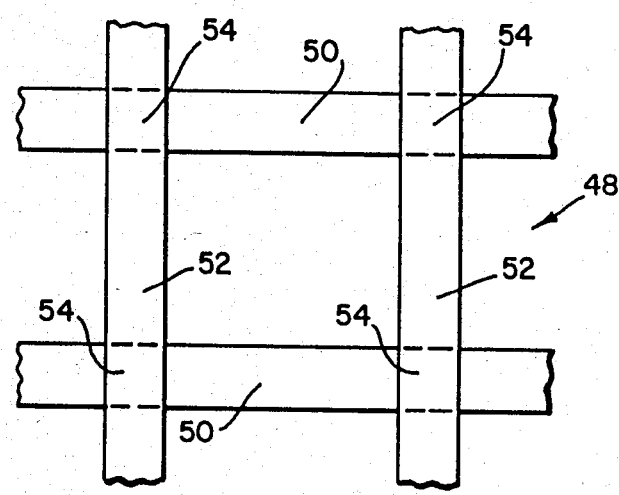
FIG. 7 is a top view of an integrated circuit device with the link point corresponding to the main conductive paths.
Figure 8:
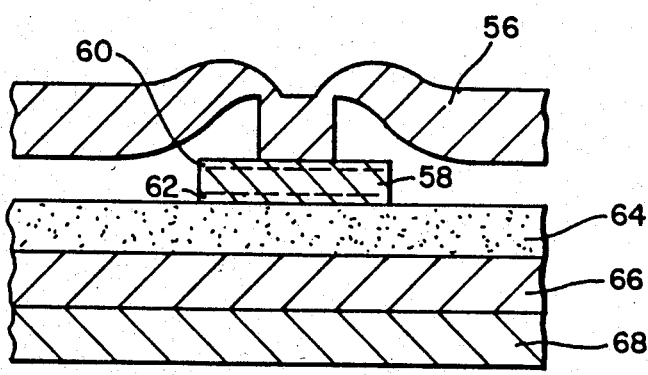
FIG. 8 is a cross-sectional view taken along line 8—8 of FIG. 7.

Referring to FIGS. 7 and 8, the integrated circuit device 48 includes first main conductive paths 50 and second main conductive paths 52 and link points 54. Each link point 54 includes the second metal layer 56, the insulator layer 58, the barrier diffusion layers 60 and 62, the first metal layer 64, the base oxide 66 and the substrate 68.

The alloy, e.g., Al, Si, Cu is deposited by sputter typically to a thickness of about 0.5 $\mu$m. The wafer then is annealed at about 450° C. for about 10 minutes in forming gas. The metal surface then is spin cleaned in isopropyl alcohol. Silicon dioxide (10 nm $\pm$ 2 nm) then is deposited by chemical vapor deposition at 425° C. The wafer then is spun cleaned in isopropyl alcohol. Amorphous silicon of 0.7 $\mu$m then is deposited by sputter deposition. The amorphous silicon surface then is spin cleaned in isoproply alcohol. Silicon dioxide, e.g., 10 nm $\pm$ 2 nm then is deposited by chemical vapor deposition at 425° C. The wafer then is spin cleaned in isopropyl alcohol and about 0.7 $\mu$m of an Al, Si, Cu alloy is deposited by sputter deposition.

We claim:

1. The process for forming an electrically conductive path between a first metal layer and a second metal layer in an integrated circuit device which comprises providing a substrate, a layer of base oxide on said substrate, a first metal layer on at least a portion of said base oxide having at least one first main conductive path, at least one first link point portion and at least one bridge portion extending between said first main conductive path and said link point portion, a layer of link insulator selected from the group consisting of amorphous germanium, amorphous silicon undoped polysilicon and polycrystalline germanium overlying at least said first link point portion, a second metal layer overlying said link insulator at a second link point portion at least in a region that also generally overlies said first link point portion to form a link point and including at least one second main conductive path and at least one bridge portion extending between said second means conductive path and said second link point, and an insulating metal diffusion barrier layer between said link insulator layer and each of said first metal layer and said second metal layer, and exposing the second metal layer of said link point to a laser pulse between about one and about three watts for a time period between about 0.01 and about 10 milliseconds to effect alloying between the first metal, said second metal and the link insulator material.

2. The process of claim 1 wherin said time period is between about 0.1 and about 1 millisecond.

3. The process of claim 1 wherein said laser pulse is between about 1 amd 1.5 watts.

* * * * *